(12) United States Patent
Fournel et al.

(10) Patent No.: US 8,382,933 B2
(45) Date of Patent: Feb. 26, 2013

(54) MOLECULAR BONDING METHOD WITH CLEANING WITH HYDROFLUORIC ACID IN VAPOR PHASE AND RINSING WITH DEIONIZED WATER

(75) Inventors: Frank Fournel, Villard-Bonnot (FR); Hubert Moriceau, Saint Egreve (FR); Christophe Morales, Saint Pierre de Mesage (FR); Pierre Perreau, Grenoble (FR)

(73) Assignee: Commissariat a l'Energie Atomique, Paris (FR)

( * ) Notice: Subject to any disclaimer, the term of this patent is extended or adjusted under 35 U.S.C. 154(b) by 735 days.

(21) Appl. No.: 12/068,638

(22) Filed: Feb. 8, 2008

(65) Prior Publication Data

US 2008/0196747 A1    Aug. 21, 2008

(30) Foreign Application Priority Data

Feb. 19, 2007  (FR) ...................................... 07 01168

(51) Int. Cl.
  *B08B 3/00*     (2006.01)
  *B29C 65/00*    (2006.01)
  *B32B 37/00*    (2006.01)
  *B32B 38/00*    (2006.01)

(52) U.S. Cl. ......................................... 156/281; 134/26

(58) Field of Classification Search ..................... 134/26; 156/281
See application file for complete search history.

(56) References Cited

U.S. PATENT DOCUMENTS

| 5,451,547 | A | | 9/1995 | Himi et al. | |
| 5,851,303 | A | * | 12/1998 | Hwang et al. | ...................... 134/3 |
| 6,065,481 | A | * | 5/2000 | Fayfield et al. | ................. 134/1.3 |
| 6,235,145 | B1 | * | 5/2001 | Li et al. | ..................... 156/345.29 |
| 6,740,247 | B1 | | 5/2004 | Han et al. | |
| 2004/0084720 | A1 | * | 5/2004 | Esser et al. | ..................... 257/328 |
| 2005/0003669 | A1 | | 1/2005 | Han et al. | |
| 2006/0115937 | A1 | * | 6/2006 | Barnett et al. | ................. 438/151 |

OTHER PUBLICATIONS

Mar. 16, 2012 Notification of Reason for Rejection issued in Japanese Application No. 2008-037281 with English-language translation.

* cited by examiner

*Primary Examiner* — Michael Orlando
(74) *Attorney, Agent, or Firm* — Oliff & Berridge, PLC

(57) ABSTRACT

Adhesion by molecular bonding of two free surfaces of first and second substrates, for example formed by monocrystalline silicon wafers, comprises at least successively:
  a cleaning step of the two free surfaces with hydrofluoric acid in vapor phase to make the two free surfaces hydrophobic,
  a rinsing step of said free surfaces with deionized water with a time less than or equal to 30 seconds
  a step of bringing said free surfaces into contact.

11 Claims, No Drawings

MOLECULAR BONDING METHOD WITH CLEANING WITH HYDROFLUORIC ACID IN VAPOR PHASE AND RINSING WITH DEIONIZED WATER

BACKGROUND OF THE INVENTION

The invention relates to a method for molecular bonding of two free surfaces respectively of first and second substrates and comprising at least successively:
a cleaning step of the two free surfaces with hydrofluoric acid making said surfaces hydrophobic
and a step of bringing the two free surfaces into contact.

STATE OF THE ART

The principle of adhesion (or bonding) by molecular bonding is based on bringing two surfaces into direct contact without using any specific material such as a glue, a wax, a metal with a low melting temperature, etc. The surfaces designed to be brought into contact can be hydrophilic or hydrophobic.

The hydrophobic surfaces can for example be the free surfaces of two monocrystalline silicon wafers. Molecular bonding of such wafers is for example used when a high electric conduction has to be obtained between the two wafers or to obtain a crystal grain seal of very large size.

The adhesion method by molecular bonding moreover requires the surfaces to be bonded to be sufficiently smooth, devoid of particles or contamination, to present a suitable surface chemistry and to be sufficiently close to one another to enable a contact to be initiated. In this case, the attractive forces between the two surfaces are high enough to cause molecular bonding. Bonding operations are generally performed at ambient temperature and ambient pressure, after chemical cleaning of the surfaces. In addition, enhancement of the bonding energies can be achieved by subsequent thermal treatment.

In the case of molecular bonding of hydrophobic surfaces, the surfaces have to be oxide-free. The cleaning operation, performed before the two surfaces are brought into contact, eliminates the oxide from said surfaces. For silicon wafers, the native oxide present at the free surface of said wafers is thus in general eliminated by soaking said wafers in a liquid solution of hydrofluoric acid (noted HF), which may be diluted. The hydrofluoric acid solution does in fact chemically attack the native oxide (by etching), thereby making the free surface of the wafers devoid of oxide and therefore hydrophobic. Furthermore, in the case of silicon, the hydrofluoric acid passivates the terminal bonds of the crystal by hydrogen atoms, making the surface hydrophobic and compatible with molecular bonding, as the two silicon surfaces attract one another when they are sufficiently close to one another.

However such a wafer cleaning or deoxidizing operation is not satisfactory. The interface of the two wafers bonded by molecular bonding after a cleaning step with liquid hydrofluoric acid is not in fact of very good quality, in particular from the electrical and mechanical point of view.

More particularly, silicon wafers initially present a RMS roughness, measured by atomic force microscopy (AFM), less than 0.2 nm. When they are subjected to a cleaning operation of a duration of about 10 minutes in an aqueous solution comprising 10% of hydrofluoric acid (pH~1.2), they present a RMS roughness of 0.24 nm, and for the same cleaning time but with an aqueous solution comprising 1% of HF (pH~1.7), the roughness of the free surfaces of the silicon wafers is about 0.32 nm. The increase of the roughness of the free surfaces of said wafers can be attributed to the presence of dissolved oxygen in the HF solutions. This dissolved oxygen oxidizes the silicon locally. The oxide thus formed is removed by HF, which creates surface irregularities and therefore a larger roughness. A large roughness of the free surfaces of the wafers can however cause an increase of the charge trappings at the interface between the two wafers bonded by molecular bonding and therefore reduce the electrical quality of said interface.

Furthermore, such a cleaning operation with liquid hydrofluoric acid also causes particle contamination of the free surfaces that is detrimental to subsequent bonding of the wafers and to the mechanical quality of the interface between the two wafers after bonding.

OBJECT OF THE INVENTION

The object of the invention is to achieve a method for molecular bonding of two free surfaces, respectively of first and second substrates, remedying the shortcomings of the prior art.

More particularly, the object of the invention is to achieve adhesion by molecular bonding of the first and second substrates with a bonding interface of very good quality, in particular from the electrical and mechanical point of view.

According to the invention, this object is achieved by the fact that the cleaning step is performed with hydrofluoric acid in vapor phase and by the fact that a rinsing step with deionized water is performed between the cleaning step and the step of bringing into contact, for a time less than or equal to 30 seconds.

According to a development of the invention, the first and second substrates are respectively formed by the compounds $Si_xGe_{1-x}$ and $Si_yGe_{1-y}$ with x and y comprised between 0 and 1.

DESCRIPTION OF PARTICULAR EMBODIMENTS

Adhesion by molecular bonding of the free surfaces of first and second substrates for example formed by monocrystalline silicon wafers comprises at least successively:
a cleaning step of the free surfaces with hydrofluoric acid in vapor phase,
a rinsing step of said free surfaces with deionized water for a time less than or equal to 30 seconds
and a step of bringing said free surfaces into contact.

The cleaning step of the free surfaces more particularly deoxidizes the free surfaces of the substrates and makes them hydrophobic. In the same way as according to the prior art, this step is performed with hydrofluoric acid (HF), but in the scope of the invention the latter is in vapor form and not in liquid form.

Substrate cleaning by etching with hydrofluoric acid in gaseous phase has already been proposed, in particular to reduce the particle contamination of the surface of said substrate. For example Patent Application US-A-2005-0003669 describes a method of cleaning semiconducting substrates by means of anhydrous hydrofluoric acid vapor and water vapor at a substrate temperature greater than or equal to 40° C.

However, it is known that treating silicon wafers with hydrofluoric acid in vapor phase does not enable molecular bonding to be performed at ambient temperature and ambient pressure. For example the free surfaces of two silicon wafers presenting a RMS roughness of 0.2 nm are cleaned in an ammonium peroxide mixture-based solution, also known under the name of APM, and their particles are removed by acoustic megasonic cleaning. The two surfaces are then hydrophilic and compatible with molecular bonding. If on the other hand additional cleaning is performed with hydrofluoric acid in vapor phase, for 3 minutes, it can be observed that the two surfaces then become hydrophobic but that they are no longer compatible with molecular bonding in spite of the absence of particles measured by means of particle detection equipment such as a Surfscan SP1 from Tencor.

Surprisingly however, it has been found that by performing a rinsing step of said free surfaces with deionized water for a short time less than or equal to 30 seconds, after a cleaning step with hydrofluoric acid in vapor phase, molecular bonding of the two surfaces became possible.

Rinsing with water has already been used in the past in other fields (US-A-2005-0003669) after cleaning with hydrofluoric acid in vapor phase. It was used to eliminate any traces of residues harmful for subsequent microelectronics processes from said surfaces. Such traces of residues originated from condensation of a part of the sub-products produced by etching of the oxide by the hydrofluoric acid vapor. Such a rinsing step with water was not however a priori envisageable in the field of molecular bonding of hydrophobic surfaces. The use of water does in fact generally reduce the hydrophobic nature of the surfaces. In the field of molecular bonding of hydrophobic surfaces however, the surfaces have to be as hydrophobic as possible and the presence of water or oxygen on said surfaces is generally minimized to preserve the hydrophobic nature of said surfaces.

In spite of such prejudices, preparation of two substrate surfaces, for example made of silicon, using hydrofluoric acid in vapor form and rinsing with deionized water for a period less than or equal to 30 seconds enables molecular bonding of the two surfaces prepared in this way to be performed at ambient temperature and at ambient pressure. It has in fact been observed that to minimize hydrophilizing of the surfaces for example made of silicon and to ensure good quality bonding, the rinsing time had to be short, typically less than or equal to 30 seconds, advantageously less than or equal to 20 seconds and even preferably less than or equal to 10 seconds. Such a time does in fact enable the hydrophobic surfaces to be preserved. Furthermore, the bonding interface obtained is of very good quality, in particular from the electrical and mechanical point of view. The surfaces of said substrates do in particular present a minimal roughness, which enables the charge trappings at the interface to be reduced as far as possible and the electrical quality of the interface to therefore be increased. Finally the surfaces present a very low particle content measured with a particle detection apparatus such as Surfscan SP1 equipment, in spite of rinsing with deionized water.

Rinsing can for example be performed by immersing the wafers in a recipient containing deionized water and removing said wafers as soon as complete immersion has been achieved. The hydrophobia of the surfaces can be verified by measuring the wetting angle of a water drop. With rinsing for 30s, the contact angle is over 70°, which is equivalent with the wetting angle of a surface treated with liquid hydrofluoric acid at 1%.

For example two silicon wafers each having a free surface covered for example with a native oxide are subjected to treatment in a hydrofluoric acid vapor for a time of at least a few seconds. The hydrofluoric acid vapor is preferably generated from a hydrofluoric acid solution which may be diluted. For example the solution can be an aqueous solution comprising 49% of hydrofluoric acid. The vapor can moreover be obtained and/or used pure or diluted in one or more other gases such as nitrogen, argon, isopropyl alcohol, etc.

Such a cleaning step enables the wafer surfaces to be deoxidized and therefore made hydrophobic. It has moreover been observed that the roughness of surfaces cleaned in this way is less high than that of surfaces treated with hydrofluoric acid in liquid phase. Thus, a silicon surface presenting a RMS roughness of 0.2 nm keeps the same roughness after etching for 3 minutes with hydrofluoric acid in vapor phase, whereas this roughness goes to 0.32 nm with etching for 1 minute with hydrofluoric acid in liquid phase at 1%.

The duration of the cleaning step in general depends on the etching rate of the oxide present at the surface of the wafers to be cleaned. In certain cases however, it may be advantageous to slightly increase the duration of the cleaning step so as to improve the molecular bonding quality. For example, if the time necessary to etch a native silicon oxide and remove the whole of the native oxide film is about 30 seconds, it may be advantageous to extend etching with hydrofluoric acid in vapor phase by a few minutes, for example advantageously 3 minutes, without damaging the surface in terms of roughness. Extension of the etching corresponds to an overetching eliminating a certain non-homogeneity of thickness of the oxide and ensuring that all the surface bonds are passivated by hydrogen atoms thereby maximizing the hydrophobicity of the surfaces.

Rinsing of said surfaces is then performed with high-quality deionized water for a time less than or equal to thirty seconds. As contact of the silicon with water takes place without the presence of hydrofluoric acid, the rinsing step with water does not have any effect on the roughness or on the particle contamination of said surfaces as in the case of use of a liquid solution diluted with HF. This rinsing step then makes the surfaces compatible with molecular bonding. Without this step, the surfaces would not adhere, although they meet the usual criteria of particle contamination (measured with a particle detection apparatus such as a Surfscan SP1) and of roughness normally necessary for molecular bonding.

For example, comparative measurements of the particle density were made on three silicon wafers with a diameter of 200 nm: the first wafer is new, the second wafer is cleaned with hydrofluoric acid in vapor phase and rinsed with deionized water and the third wafer is cleaned, according to the prior art, by means of a hydrofluoric acid solution.

The measurements were made by means of a Surfscan SP1 particle detection apparatus so as to measure the density of particles present on the surface of each wafer and having a size for example larger than 0.12 μm.

It was observed that the particle density remains substantially constant for the first and second wafers, i.e. respectively before and after treatment with hydrofluoric acid in vapor phase and rinsing with deionized water. The density is for example about fifteen particles. Treatment with hydrofluoric acid and rinsing with deionized water therefore does not cause an increase of the density of contaminating particles, unlike cleaning performed with a hydrofluoric acid solution (particle density of about a hundred particles). On the contrary, the particle density remains substantially constant, and in certain cases such as that of a silicon wafer presenting a thin oxide layer (thickness<10 nm) and a certain initial particle density, the particle density may even be reduced.

The invention is not limited to the embodiments described above. For example, the bonding method may also concern a silicon substrate and a germanium substrate or two germanium substrates and more generally bonding of a $Si_xGe_{1-x}$ substrate with a $Si_yGe_{1-y}$ substrate with x and y comprised between 0 and 1.

We claim:

1. A method for molecular bonding two substrates comprising at least successively:
   providing a first substrate and a second substrate, each substrate comprising a bonding surface made of a semiconductive layer;
   freeing the bonding surfaces and rendering the bonding surfaces hydrophobic with hydrofluoric acid in a vapor phase to produce free hydrophobic bonding surfaces devoid of silicon oxide;
   rinsing the two free hydrophobic bonding surfaces with deionized water for a time less than or equal to 30 seconds; and
   bringing the two free bonding hydrophobic surfaces made of semiconductive layers into contact.

2. The method according to claim 1, wherein the first substrate and the second substrate are respectively formed by compounds $Si_x Ge_{1-x}$ and $Si_y Ge_{1-y}$ with x and y comprised between 0 and 1.

3. The method according to claim 1, wherein the hydrofluoric acid in vapor phase is pure.

4. The method according to claim 1, wherein the hydrofluoric acid in vapor phase is mixed with at least one other gas.

5. The method according to claim 4, wherein the other gas is selected from the group consisting of nitrogen, argon, and isopropyl alcohol.

6. A method for molecular bonding two substrates comprising at least successively:
   providing a first substrate and a second substrate, each substrate comprising a bonding surface made of a semiconductive layer;
   freeing the bonding surfaces and rendering the two free surfaces hydrophobic with hydrofluoric acid in a vapor phase;
   rinsing the two free hydrophobic bonding surfaces with deionized water for a time less than or equal to 30 seconds; and
   bringing the two free bonding hydrophobic surfaces made of semiconductive layers into contact, wherein
   at least one of the first substrate and the second substrate is formed by a compound of $Si_x Ge_{1-x}$ where $0<x<1$.

7. A method for molecular bonding two substrates comprising at least successively:
   providing a first substrate and a second substrate, each substrate comprising a bonding surface made of a semiconductive layer;
   freeing the bonding surfaces and rendering the bonding surfaces hydrophobic with hydrofluoric acid in a vapor phase to produce free hydrophobic bonding surfaces devoid of silicon oxide; directly followed by
   rinsing the two free hydrophobic bonding surfaces with deionized water for a time less than or equal to 30 seconds; and
   bringing the two free hydrophobic bonding surfaces made of semiconductive layers into contact.

8. The method according to claim 7, wherein the step of rinsing the two free hydrophobic surfaces is directly followed by the step of bringing the two free hydrophobic surfaces into contact.

9. The method according to claim 1, wherein the step of rinsing the two free hydrophobic surfaces with deionized water is performed by immersing the first and second substrates in deionized water and removing substrates as soon as complete immersion has been achieved.

10. The method according to claim 1, wherein the method is performed at ambient temperature and at ambient pressure.

11. The method according to claim 1, wherein the step of rendering the two free surfaces hydrophobic is performed with only pure hydrofluoric acid in a vapor phase.

* * * * *